United States Patent
Lim et al.

(10) Patent No.: US 9,869,713 B2
(45) Date of Patent: Jan. 16, 2018

(54) THROUGH-SILICON VIA (TSV) CRACK SENSORS FOR DETECTING TSV CRACKS IN THREE-DIMENSIONAL (3D) INTEGRATED CIRCUITS (ICS) (3DICS), AND RELATED METHODS AND SYSTEMS

(71) Applicant: QUALCOMM Incorporated, San Diego, CA (US)

(72) Inventors: Sung Kyu Lim, Duluth, GA (US); Ratibor Radojcic, San Diego, CA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 266 days.

(21) Appl. No.: 14/639,511

(22) Filed: Mar. 5, 2015

(65) Prior Publication Data
US 2016/0258996 A1    Sep. 8, 2016

(51) Int. Cl.
| | |
|---|---|
| G01R 31/02 | (2006.01) |
| G01R 31/28 | (2006.01) |
| G01R 19/165 | (2006.01) |
| H01L 23/48 | (2006.01) |
| H01L 23/58 | (2006.01) |

(Continued)

(52) U.S. Cl.
CPC ... *G01R 31/2851* (2013.01); *G01R 19/16533* (2013.01); *G01R 31/2853* (2013.01); *H01L 22/34* (2013.01); *H01L 23/481* (2013.01); *H01L 23/585* (2013.01); *H01L 23/647* (2013.01); *H01L 27/0688* (2013.01); *G01R 31/318513* (2013.01); *H01L 22/14* (2013.01)

(58) Field of Classification Search
CPC ............ G01N 27/302; G01N 27/4165; G01N 31/221; G01N 31/002; G01N 31/26
See application file for complete search history.

(56) References Cited

U.S. PATENT DOCUMENTS

| | | | |
|---|---|---|---|
| 8,618,539 B2 | 12/2013 | Henderson et al. | |
| 8,704,226 B2 | 4/2014 | Morimoto et al. | |

(Continued)

OTHER PUBLICATIONS

Guard Ring Effect for Through Silicon Via (TSV) Noise Coupling Reduction by Jonghyun Cho.*

(Continued)

*Primary Examiner* — Tung X Nguyen
*Assistant Examiner* — Dominic Hawkins
(74) *Attorney, Agent, or Firm* — Withrow & Terranova, PLLC

(57) ABSTRACT

Through-silicon via (TSV) crack sensors for detecting TSV cracks in three-dimensional (3D) integrated circuits (ICs) (3DICs), and related methods and systems are disclosed. In one aspect, a TSV crack sensor circuit is provided in which doped rings for a plurality of TSVs are interconnected in parallel such that all interconnected TSV doped rings may be tested at the same time by providing a single current into the contacts of the interconnected doped rings. In another aspect, a TSV crack sensor circuit is provided including one or more redundant TSVs. Each doped ring for a corresponding TSV is tested independently, and a defective TSV may be replaced with a spare TSV whose doped ring is not detected to be cracked. This circuit allows for correction of a compromised 3DIC by replacing possibly compromised TSVs with spare TSVs.

27 Claims, 10 Drawing Sheets

(51) Int. Cl.
*H01L 23/64* (2006.01)
*H01L 27/06* (2006.01)
*H01L 21/66* (2006.01)
*G01R 31/3185* (2006.01)

(56) References Cited

U.S. PATENT DOCUMENTS

| | | | |
|---|---|---|---|
| 8,754,704 | B2 | 6/2014 | Huang |
| 8,803,308 | B2 | 8/2014 | Ishikawa |
| 2009/0201043 | A1* | 8/2009 | Kaltalioglu ........ G01R 31/2858 324/750.3 |
| 2010/0060310 | A1 | 3/2010 | Laisne et al. |
| 2010/0109005 | A1* | 5/2010 | Grillberger ............. H01L 22/34 257/48 |
| 2010/0140749 | A1* | 6/2010 | Kuo ....................... H01L 23/481 257/621 |
| 2010/0164062 | A1* | 7/2010 | Wang ................ H01L 21/76898 257/532 |
| 2010/0295600 | A1 | 11/2010 | Kim et al. |
| 2012/0133030 | A1* | 5/2012 | Wang ................ H01L 21/76898 257/621 |
| 2013/0009663 | A1* | 1/2013 | Gauch ..................... H01L 22/34 324/762.01 |
| 2013/0159587 | A1 | 6/2013 | Nygren et al. |
| 2014/0054742 | A1* | 2/2014 | Katti ................... H01L 23/5223 257/503 |
| 2014/0191410 | A1* | 7/2014 | Leatherman ............ H01L 22/34 257/774 |
| 2014/0248721 | A1* | 9/2014 | Kobayashi .............. H01L 22/14 438/15 |
| 2015/0303120 | A1* | 10/2015 | Zhang .................... H01L 22/14 257/738 |
| 2015/0348647 | A1* | 12/2015 | Veches ............. G11C 29/12005 714/42 |

OTHER PUBLICATIONS

International Search Report and Written Opinion for PCT/US2016/016698, mailed May 3, 2016, 11 pages.
Kang, U. et al., "8 Gb 3-D DDR3 DRAM Using Through-Silicon-Via Technology," IEEE Journal of Solid-State Circuits, vol. 45, No. 1, Jan. 2010, IEEE, pp. 111-119.
Loi, I. et al., "A Low-overhead Fault Tolerance Scheme for TSV-based 3D Network on Chip Links," IEEE/ACM International Conference on Computer-Aided Design (ICCAD 2008), Nov. 10-13, 2008, San Jose, CA, IEEE, pp. 598-602.
Lung, C.-L et al., "Through-Silicon Via Fault-Tolerant Clock Networks for 3-D ICs," IEEE Transactions on Computer Aided Design of Integrated Circuits and Systems, vol. 32, No. 7, Jul. 2013, IEEE, pp. 1100-1109.
Zhang, C. et al., "Novel Crack Sensor for TSV-based 3D Integrated Circuits: Design and Deployment Perspectives," IEEE/ACM International Conference on Computer-Aided Design (ICCAD 2013), Nov. 18-21, 2013, San Jose, CA, IEEE, pp. 371-378.
Second Written Opinion for PCT/US2016/016698, dated Feb. 14, 2017, 5 pages.
International Preliminary Report on Patentability for PCT/US2016/016698, dated Jun. 13, 2017, 25 pages.
Author Unknown, "Through-silicon via," Wikipedia, The Free Encyclopedia, last edited: Jan. 31, 2017, retrieved from: https://en.wikipedia.org/w/index.php?title=Through-silicon_via &oldid=762971171, 3 pages.

* cited by examiner

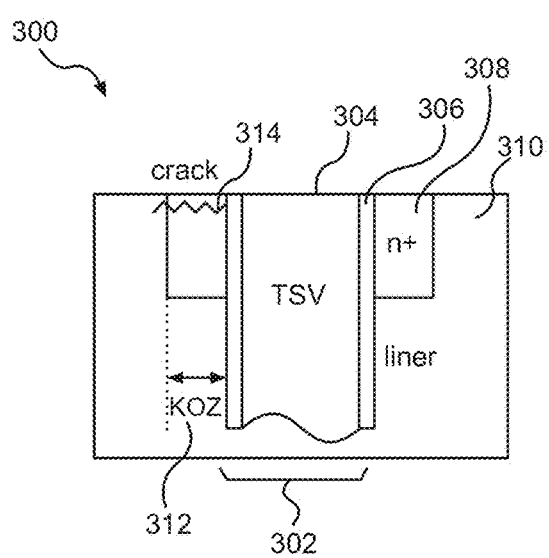 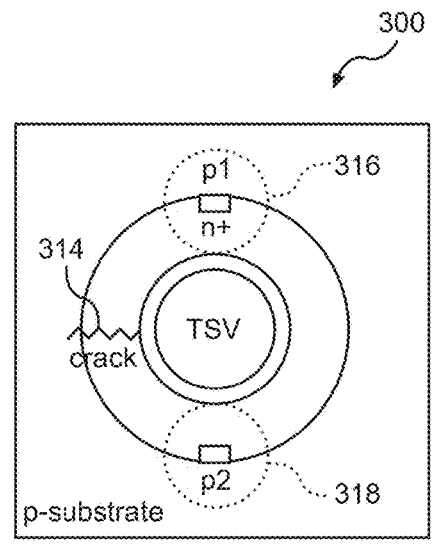
FIG. 3A  FIG. 3B
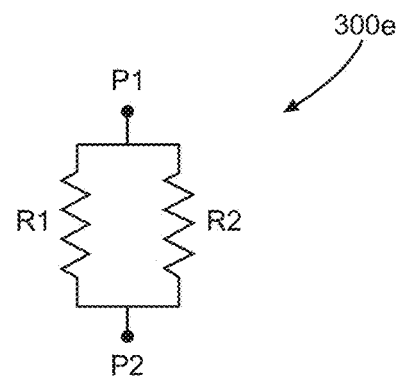
FIG. 3C

THROUGH-SILICON VIA (TSV) CRACK SENSORS FOR DETECTING TSV CRACKS IN THREE-DIMENSIONAL (3D) INTEGRATED CIRCUITS (ICS) (3DICS), AND RELATED METHODS AND SYSTEMS

BACKGROUND

I. Field of the Disclosure

The technology of the disclosure relates generally to through-silicon vias (TSVs) for three-dimensional (3D) integrated circuits (ICs) (3DICs), and more particularly to the detection of silicon substrate surface cracks therein.

II. Background

Computing devices have become commonplace throughout society. The increasing presence of such computing devices has accelerated in part because of the increasing functionality and versatility of such computing devices. This increase in functionality and versatility has been enabled by providing increasingly powerful processing capabilities in small packages as loosely recognized by Moore's Law. As a result, companies have been trying to increase functional integration more quickly than Moore's Law or circuit performance requirements. However, pressures to increase processing capabilities while decreasing the size of integrated circuits (ICs) have strained conventional manufacturing processes, especially as node size within the ICs has been reduced to low nanometer (nm) dimensions (e.g., <20 nm). Thus, there has been a proliferation of interconnect schemes such as silicon in package, package-on-package, and system-in-a-package (SiP) multi-chip modules (MCMs) schemes to decrease the size of ICs.

Current miniaturization techniques include three-dimensional (3D) integrated circuits (3DICs). In 3DICs, ICs are arranged in an x-y-z coordinate system in a plurality of layers or tiers (referred to as "layers" hereinafter). Such an arrangement achieves higher device packing density, lower interconnect delay, and lower costs than a two-dimensional (2D) arrangement (i.e., ICs arranged in an x-y coordinate system in a single layer). Techniques to manufacture or form 3DICs include some form of through-silicon vias (TSVs) to effectuate electrical connections between the stacked wafers or dies (i.e., connections between ICs arranged in the z direction layers of the x-y-z coordinate system). In this regard, FIG. 1 illustrates an example of a 3DIC 100. The 3DIC 100 includes a plurality of stacked, fabricated IC layers 102(1)-102(N) that each include electrical circuits 104. TSVs 106 are fabricated in the 3DIC 100 to interconnect the electrical circuits 104 between the different IC layers 102(1)-102(N).

Defects in any of the stacked IC layers 102(1)-102(N) can result in the 3DIC 100 in FIG. 1 being defective due to the interdependence of the 3DIC 100 on the various IC layers 102(1)-102(N). Defects may be caused by, for example, thermal expansion of a TSV 106 due to a coefficient of thermal expansion (CTE) mismatch between the TSV 106 and its surroundings. This CTE mismatch-induced stress between the TSV 106 and its surroundings may generate radial cracks propagating from the TSV 106 towards the silicon substrate surface during a back-end of line (BEOL) process employed during fabrication of the 3DIC 100, as BEOL processes include one or more thermal cycles. In this regard, FIG. 2A illustrates a Scanning Electron Microscope (SEM) view of a TSV 106 in the 3DIC 100 in FIG. 1 that has cracked during fabrication due to thermal expansion due to CTE-mismatch-induced stress. FIG. 2B shows a portion of the TSV 106 in FIG. 2A and a radial crack 200 in the silicon substrate surface adjacent to the TSV 106 caused due to thermal expansion of the TSV 106. If a crack, such as the radial crack 200, reaches a nearby device disposed on the substrate (e.g., a transistor), the radial crack 200 may damage the nearby device, which may render the 3DIC 100 inoperable.

In this regard, 3DIC designs typically provide for a keep-out-zone (KOZ) to be observed in a radial area around TSVs during 3DIC fabrication to avoid CTE mismatch-induced cracks from damaging adjacent silicon substrate surfaces. However, if a TSV crack propagates beyond the KOZ, it may jeopardize the reliability of the devices along its propagation path, and therefore, the corresponding stacked wafer and 3DIC system. Although a large KOZ area would increase the reliability and/or fabrication yield of 3DICs, it is desired that a KOZ is kept small to conserve area in the 3DIC.

A technique for testing a 3DIC for TSV cracks is to indirectly detect critical cracks by checking for various device and circuit level faults such as timing violations, stuck-at faults, etc. caused by the TSV cracks. However, with limited testing coverage, large number of TSVs, and various possible crack propagation directions, such a technique, may fail to identify every chip with TSV cracks. In other words, a direct TSV crack detection technique is imperative to guarantee shipping only TSV-crack-free chips.

Traditionally, direct detection of TSV cracks has been primarily based on microscope or X-ray diffraction analysis. However, such techniques are time-consuming and cost-prohibitive for large-scale 3DIC production. Accordingly, there is a need to provide practical, relatively fast, and cost-effective techniques for direct detection of TSV cracks in 3DICs' silicon substrate surfaces.

Furthermore, such traditional techniques for direct detection of TSV cracks in 3DICs' silicon substrate surfaces can only indicate that at least one of the TSVs is cracked, not which doped ring is cracked. Accordingly, finding a TSV crack is conventionally addressed by discarding the corresponding 3DIC, and reducing manufacturing yields. Further still, such traditional techniques for direct detection of TSV cracks in 3DICs' silicon substrate surfaces may only be applied during the manufacturing cycle. If a TSV crack develops after the corresponding 3DIC is embedded in a system, the TSV crack may cause the entire system to be discarded, increasing costs and decreasing customer satisfaction. Therefore, there is a need to provide ways to repair, in real-time, a 3DIC that has been determined to contain TSV cracks.

SUMMARY OF THE DISCLOSURE

Aspects disclosed in the detailed description include through-silicon via (TSV) crack sensors for detecting TSV cracks in three-dimensional (3D) integrated circuits (ICs) (3DICs). Related methods and systems are also disclosed. To detect cracks in TSVs in a 3DIC that may cause silicon substrate cracks in the 3DIC due to a coefficient of thermal expansion (CTE) mismatch between materials used to create the TSVs and the corresponding substrate, TSV crack sensors are provided in the 3DIC. The TSV crack sensors are disposed around a corresponding TSV in the 3DIC. In one aspect, the TSV crack sensor is comprised of a doped ring disposed around a corresponding TSV. Specifically, a crack that traverses the doped ring will create a discontinuity along the doped ring and increase a resistance of the doped ring. Accordingly, a crack in a TSV may be detected by providing a current into the doped ring and measuring the resistance between contacts in the doped ring. If the resistance exceeds a predetermined threshold, a crack may be present in the surrounding silicon substrate, possibly rendering the 3DIC defective. This allows for direct detection of TSV cracks in real-time by connectivity analysis, instead of the more expensive and time-consuming microscope and X-ray diffraction conventional tests. This also facilitates direct detection of TSV cracks outside the fabrication cycle, allowing for detection of TSV cracks after the corresponding 3DIC has been embedded in a system.

In one aspect, a TSV crack sensor circuit is provided in which doped rings for a plurality of TSVs are interconnected in parallel such that all interconnected TSV doped rings may be tested at the same time by providing a single current into the contacts of the interconnected doped rings. This significantly reduces the number of connectors necessary to test a 3DIC for TSV cracks, because only one set of test connectors would be necessary to test the interconnected TSVs doped rings instead of a set of connectors per TSV doped ring, and thus, higher density of devices in the 3DIC can be achieved. However, testing a plurality of doped rings for TSVs at the same time can only determine that at least one of the coupled doped rings is cracked, not which doped ring is cracked. In this regard, other aspects disclosed herein are further directed to a TSV crack sensor circuit that includes one or more redundant TSVs. Each doped ring for a corresponding TSV is tested independently, and a defective TSV may be replaced with a spare TSV whose doped ring is not detected to be cracked. This circuit allows for correction of a compromised 3DIC by replacing possibly compromised TSVs with spare TSVs.

In this regard, in one aspect, a 3DIC is provided that includes a plurality of TSVs configured to interconnect at least two layers of the 3DIC. The 3DIC also comprises a plurality of TSV crack sensors. Each TSV crack sensor among the plurality of TSV crack sensors corresponds to a TSV of the plurality of TSVs. Each TSV crack sensor includes a doped ring disposed around the corresponding TSV, a first contact disposed on a first location of the doped ring, and a second contact disposed on a second location of the doped ring such that doped ring resistance comprising a parallel resistance of a first resistance and a second resistance is provided in the doped ring between the first contact and the second contact. The 3DIC further includes a first interconnection coupled to the first contact of each TSV crack sensor among the plurality of TSV crack sensors and coupled to a first conductor. The 3DIC also includes a second interconnection coupled to the second contact of each TSV crack sensor among the plurality of TSV crack sensors and coupled to a second conductor.

In another aspect, a method for testing a 3DIC for TSV cracks is provided. The method comprises providing a current to a first interconnection point of a network of parallel TSV crack sensors, measuring a voltage across the network of parallel TSV crack sensors based on the current, and comparing the measured voltage to a nominal voltage. The method further comprises providing an indication that the 3DIC is defective if the measured voltage is higher than the nominal voltage, and providing an indication that the 3DIC is not defective if the measured voltage is substantially equal to the nominal voltage.

In another aspect, a TSV redundant crack sensor circuit for a 3DIC is provided. The TSV redundant crack sensor circuit comprises a TSV pair configured to interconnect at least two layers of the 3DIC. The TSV redundant crack sensor circuit also comprises a TSV crack sensor pair. Each TSV crack sensor of the TSV crack sensor pair corresponds to a TSV of the TSV pair. Each TSV crack sensor comprises a doped ring disposed around the corresponding TSV, and a first contact disposed on a first location of the doped ring. Each TSV crack sensor also comprises a second contact disposed on a second location of the doped ring such that a first resistance and a second resistance are provided in the doped ring between the first contact and the second contact. The TSV redundant crack sensor circuit further comprises a controller corresponding to the TSV pair. The controller is coupled to each TSV crack sensor of the TSV crack sensor pair. The controller is configured to select the TSV from the corresponding TSV pair based on sensor information from each TSV crack sensor of the corresponding TSV crack sensor pair.

In another aspect, a method for selecting a TSV in a TSV redundant crack sensor circuit for a 3DIC is provided. The method comprises providing, by a current source, a current into a first contact of a first TSV crack sensor of a TSV crack sensor pair corresponding to a first TSV of a TSV pair. The method also comprises determining, by a control circuit, if a crack is not present in a doped ring disposed around the first TSV of the TSV pair. The method further comprises selecting, by the control circuit, the first TSV of the TSV pair when a processor determines that a crack is not present in the doped ring disposed around the first TSV of the TSV pair.

BRIEF DESCRIPTION OF THE FIGURES

FIG. 3A illustrates a side view of an exemplary TSV for a 3DIC and an exemplary TSV crack sensor in the form of a doped ring disposed radially around the TSV;

FIG. 3B illustrates a top view of the exemplary TSV and the exemplary TSV crack sensor in FIG. 3A;

FIG. 3C illustrates a circuit representation of the doped ring of the TSV crack sensor in FIGS. 3A and 3B;

DETAILED DESCRIPTION

Figure 1:
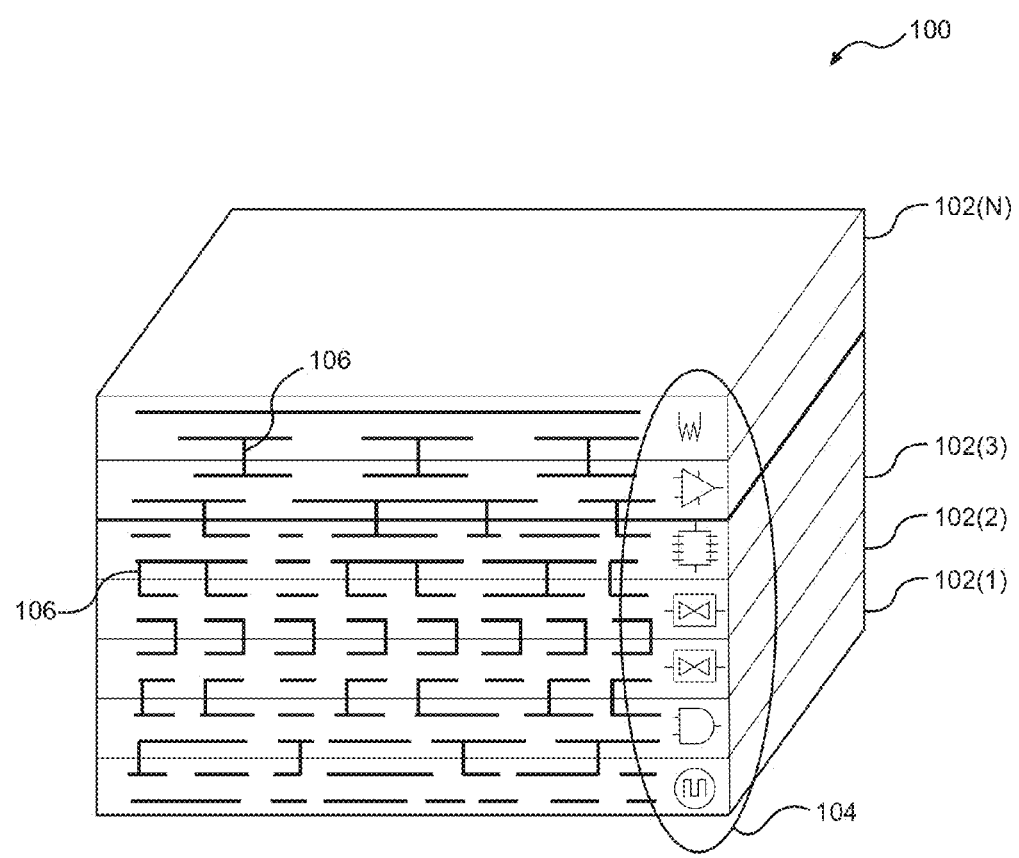
FIG. 1 is a block diagram of a three dimensional (3D) integrated circuit (IC) (3DIC) in the prior art.
Figure 2A:
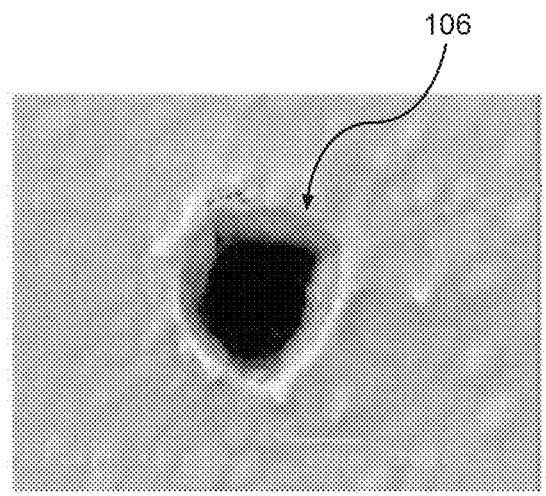
FIG. 2A illustrates a Scanning Electron Microscope (SEM) top view of a cracked TSV in the prior art.
Figure 2B:
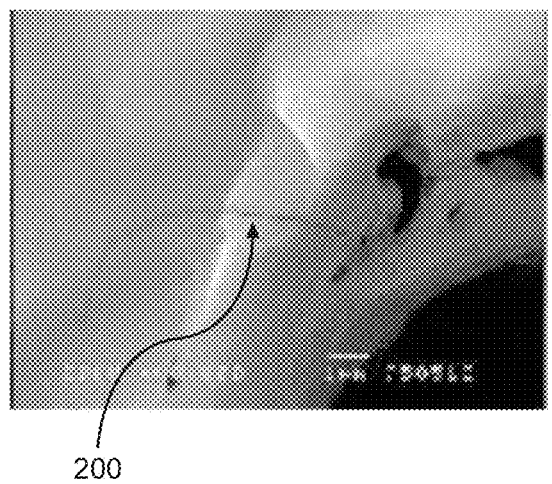
FIG. 2B illustrates a close-up view of a crack in a surrounding silicon substrate of a TSV due to a crack in the TSV in FIG. 2A in the prior art.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include through-silicon via (TSV) crack sensors for detecting TSV cracks in three-dimensional (3D) integrated circuits (ICs) (3DICs). Related methods and systems are also disclosed. To detect cracks in TSVs in a 3DIC that may cause silicon substrate cracks in the 3DIC due to a coefficient of thermal expansion (CTE) mismatch between materials used to create the TSVs and the corresponding substrate, TSV crack sensors are provided in the 3DIC. The TSV crack sensors are disposed around a corresponding TSV in the 3DIC. In one aspect, the TSV crack sensor is comprised of a doped ring disposed around a corresponding TSV. Specifically, a crack that traverses the doped ring will create a discontinuity along the doped ring and increase a resistance of the doped ring. Accordingly, a crack in a TSV may be detected by providing a current into the doped ring and measuring the resistance between contacts in the doped ring. If the resistance exceeds a predetermined threshold, a crack may be present in the surrounding silicon substrate, possibly rendering the 3DIC defective. This allows for direct detection of TSV cracks in real-time by connectivity analysis, instead of the more expensive and time-consuming microscope and X-ray diffraction conventional tests. This also facilitates direct detection of TSV cracks outside the fabrication cycle, allowing for detection of TSV cracks after the corresponding 3DIC has been embedded in a system.

In one aspect, a TSV crack sensor circuit is provided in which doped rings for a plurality of TSVs are interconnected in parallel such that all interconnected TSV doped rings may be tested at the same time by providing a single current into the contacts of the interconnected doped rings. This significantly reduces the number of connectors necessary to test a 3DIC device for TSV cracks, because only one set of test connectors would be necessary to test the interconnected TSVs doped rings instead of a set of connectors per TSV doped ring, and thus, higher density of devices in the 3DIC can be achieved. However, testing a plurality of doped rings for TSVs at the same time can only determine that at least one of the coupled doped rings is cracked, not which doped ring is cracked. In this regard, other aspects disclosed herein are further directed to a TSV crack sensor circuit that includes one or more redundant TSVs. Each doped ring for a corresponding TSV is tested independently, and a defective TSV may be replaced with a spare TSV whose doped ring is not detected to be cracked. This circuit allows for correction of a compromised 3DIC by replacing possibly compromised TSVs with spare TSVs.

In this regard, FIG. 3A illustrates a side view of a section 300 of an exemplary 3DIC, such as the 3DIC 100 illustrated in FIG. 1, including a TSV 302, which includes a conductive section 304, a dielectric liner 306, a doped ring 308, and a substrate 310. FIG. 3B illustrates a top view of the section 300 in FIG. 3A, further illustrating a set of contacts P1 and P2. As will be explained with further detail below, an exemplary TSV crack sensor includes the doped ring 308 and contacts P1 and P2.

The TSV 302 provides an electrical connection through a silicon wafer or die of the 3DIC. Specifically, electrical circuits set in different layers of the 3DIC, such as the electrical circuits 104 of the 3DIC 100 of FIG. 1, may be interconnected through the conductive section 304 of the TSV 302 to, for example, exchange information or perform a given task. The dielectric liner 306 of the TSV 302 isolates the conductive section 304 from the substrate 310. Typically, the conductive section 304 includes a conductive material such as, for example, tungsten or copper. The dielectric liner 306 may include, for example, a Titanium Nitrate (TiN) liner.

The section 300 in this example further includes the doped ring 308 which, as noted above, is part of an exemplary TSV crack sensor, in the form of an n+ doped ring around the TSV 302. The doped ring 308 extends radially from the TSV 302 to cover at least a predetermined keep-out-zone (KOZ) 312 of the TSV 302. The KOZ 312 is a radial area observed around the TSV 302 during 3DIC fabrication to avoid CTE mismatch-induced cracks from damaging adjacent silicon substrate surfaces and devices disposed therein. If a TSV crack, illustrated in FIGS. 3A and 3B as crack 314, propagates beyond the KOZ 312, it may jeopardize the reliability of devices disposed along its propagation path outside the KOZ 312. In this regard, the doped ring 308 is disposed during 3DIC fabrication over a substrate 310, in this example in the form of a p-type substrate, or p-substrate, to add a conductive path around the TSV 302 that covers at least the predetermined KOZ 312 of the TSV 302. Thus, a discontinuity in the conductive path caused by the crack 314 extending radially through the doped ring 308 may be detected and provide an indication that the crack 314 reached the KOZ 312, rendering the 3DIC damaged or unusable.

With continuing reference to FIGS. 3A and 3B, the section 300 further includes contacts P1 and P2 which, as noted above, are part of an exemplary TSV crack sensor. Contacts P1 and P2 may be, for example, ohmic contacts, which provide a linear current-voltage curve and a low resistance, non-rectifying junction between the doped ring 308 and an element external to the doped ring 308. These features make contacts P1 and P2 particularly suited for very small voltage operations. In this example, contacts P1 and P2 are disposed at first and second locations 316 and 318, respectively, such that they are located at symmetrically opposite locations of the boundary of the doped ring 308, relative to the TSV 302. This allows for a resistance across contacts P1 and P2 through a left-hand path of the doped ring 308 to be substantially similar to a resistance across contacts P1 and P2 through a right-hand path of the doped ring 308. In this manner, as will be discussed in more detail below, the doped ring 308 can be tested for cracks (i.e., discontinuity across the doped ring 308), such as the crack 314, by providing a current into, and measuring a corresponding voltage across, contacts P1 and P2.

The functionality of the TSV crack sensor of the section 300 (i.e., use of the doped ring 308 and contacts P1 and P2 to sense the crack 314 in the substrate 310 surface of the section 300) can be explained using the equivalent circuit 300e shown in FIG. 3C, where R1 and R2 model the left- and right-hand side resistances in the doped ring 308, respectively. It is not possible to conduct current between contacts P1 and P2 through a path in the substrate 310 (e.g., n+ doped ring to p substrate to n+ doped ring), because any such path will encounter two p-n junctions/diodes connected back-to-back. If a current and voltage between the contacts P1 and P2 are represented by variables I and V, respectively, a voltage between the contacts P1 and P2 can be expressed as $$V = \frac{R1R2}{R1+R2}I$$

In a discontinuity-free situation where the crack 314 does not extend radially through the doped ring 308, assume R1=R2=R, V=0.5 RI, which for purposes of the present discussion is defined as a nominal value. When the crack 314, shown in FIGS. 3A and 3B, with depth larger than that of the doped region of the doped ring 308 (for example, and not as limitation, 5-10 nm with ultra shallow injection) occurs and completely cuts through the doped ring 308, a conduction path is broken. Since, as noted above, it is not possible to conduct current through the substrate 310, one of the R1 and R2 resistances becomes an open circuit (i.e., relatively large resistance), which leads to V=IR, or twice the nominal value, allowing for a determination of whether the crack 314 extends across the doped ring 308 by measuring a difference between a measured voltage across the contacts P1 and P2, and the nominal value.

Although the TSV crack sensing scheme described above facilitates the testing of 3DIC TSVs, embedding a TSV crack sensor in each TSV may add area overhead to each TSV. Specifically, contacts P1 and P2, and any interconnections necessary to provide access to such contacts externally, may incur significant area overhead in the silicon substrate surface of a 3DIC. Thus, because a 3DIC may include hundreds or even thousands of TSVs, it may be impractical to provide a TSV crack sensor for every TSV in the 3DIC.

Figure 4:
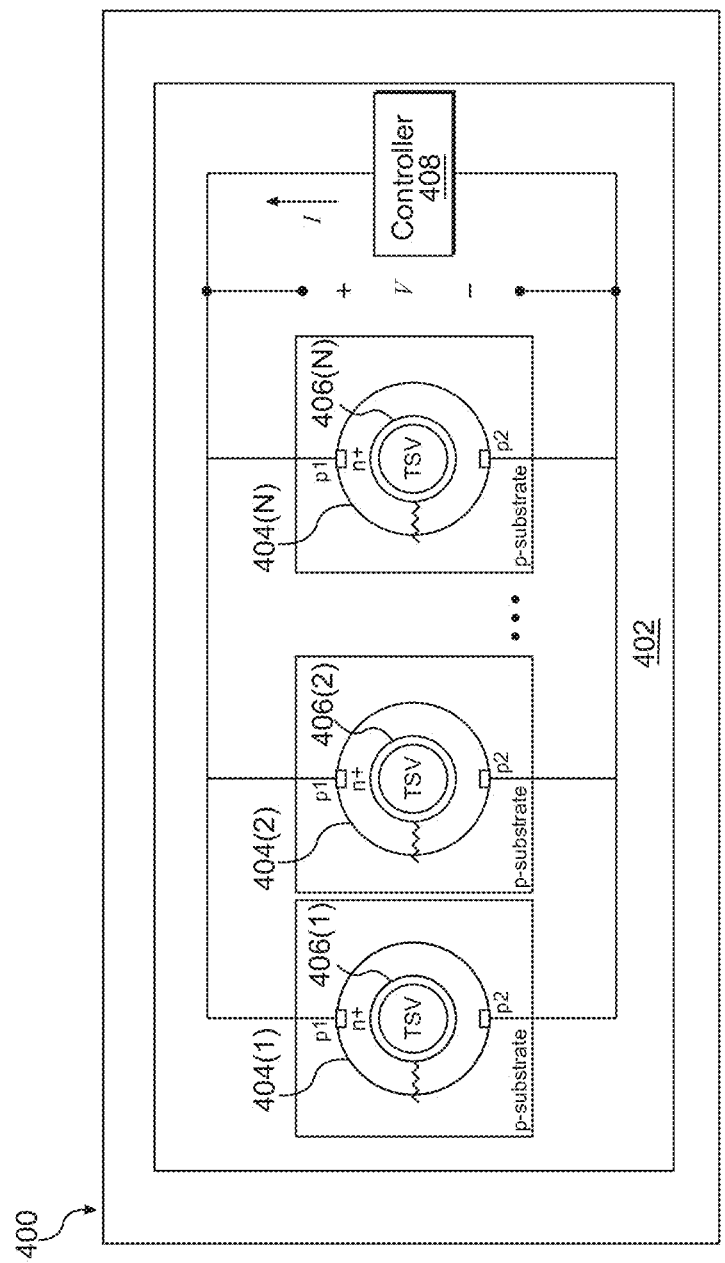
FIG. 4 illustrates a top view of an exemplary TSV crack sensor circuit in which doped rings of TSV crack sensors for a plurality of TSVs are interconnected in parallel such that all interconnected TSV doped rings may be tested at the same time by providing a single current into the contacts of the interconnected doped rings.

In this regard, FIG. 4 illustrates an exemplary 3DIC 400, including an exemplary TSV crack sensor circuit 402. The TSV crack sensor circuit 402 includes a plurality of TSV crack sensors 404(1)-404(N) for a plurality of corresponding TSVs 406(1)-406(N). Each TSV crack sensor 404(1)-404(N) includes a corresponding doped ring 308 and contacts P1 and P2, as illustrated in FIGS. 3A and 3B. These elements of the TSV crack sensors 404(1)-404(N) are similar to those described with reference to FIGS. 3A and 3B, and thus, their description is omitted here to not obscure the description of the exemplary TSV crack sensor circuit 402.

In this example, the TSV crack sensors 404(1)-404(N) are interconnected in parallel such that all interconnected doped rings 308 of the TSV crack sensors 404(1)-404(N) may be tested at the same time. Specifically, a single current I provided into, and received by, the plurality of TSV crack sensors 404(1)-404(N) generates a voltage V across the parallel interconnection. The current can be provided, and the voltage can be monitored, by a controller 408 coupled to the parallel interconnected contacts.

If the controller 408 detects a larger voltage in the TSV crack sensor circuit 402 than a corresponding nominal voltage, this is an indication that in at least one of the TSV crack sensors 404(1)-404(N) a crack extends radially through its corresponding doped ring 308. Specifically, if, as described with respect to FIGS. 3A and 3B, each doped ring 308 of the TSV crack sensors 404(1)-404(N) is set to cover at least a corresponding KOZ 312, an indication of a discontinuity in a doped ring 308 provides an indication that a crack has reached a corresponding KOZ 312, rendering the 3DIC 400 damaged or unusable.

Figure 5:
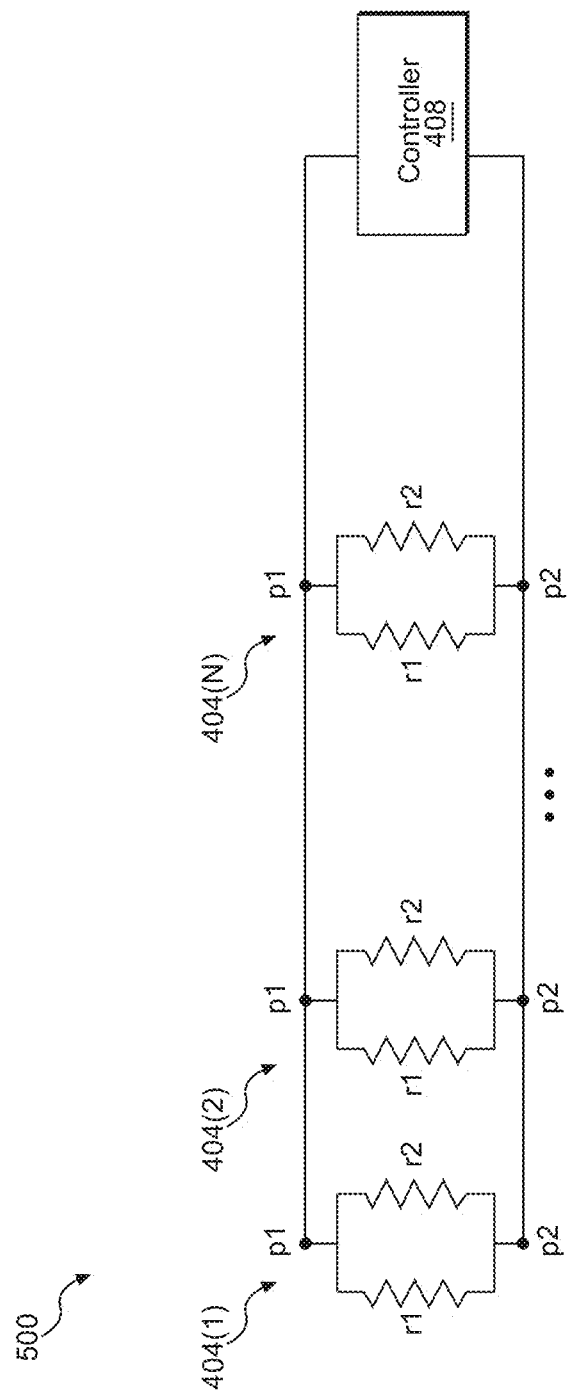
FIG. 5 illustrates a circuit representation of the TSV crack sensor circuit in FIG. 4.

The functionality of the TSV crack sensor circuit 402 can be explained using an equivalent circuit 500 shown in FIG. 5, where R1 and R2 model the left- and right-hand side resistances in the doped rings 308 of TSV crack sensors 404(1)-404(N), respectively. Again, representing a current and voltage between the contacts P1 and P2 as I and V, respectively, and R1=R2=R for each of TSV crack sensors 404(1)-404(N), in a discontinuity-free situation a voltage between the contacts P1 and P2 can be expressed as $$V = \frac{R}{2N}I$$

where N is the number of TSV crack sensors 404(1)-404(N) in TSV crack sensor circuit 402 of FIG. 4. For purposes of the present discussion this value for V is defined as a nominal value for the described TSV crack sensor circuit 402. When a crack 314, as shown in FIGS. 3A and 3B, with depth larger than that of the doped region of one of the doped rings 308 (for example, and not as limitation, 5-10 nm with ultra shallow injection) occurs and completely cuts through the corresponding doped ring 308, a conduction path is broken. The corresponding resistance becomes an open circuit (i.e., relatively large resistance), which leads to $$V = \frac{R}{2N-1}I$$

allowing for a determination of whether a crack extends across a doped ring 308 of the plurality of TSV crack sensors 404(1)-404(N) in the TSV crack sensor circuit 402 by measuring a difference between a measured voltage across the contacts P1 and P2 and the corresponding nominal value. If the crack 314 occurs on multiple TSV crack sensors 404(1)-404(N), the corresponding resistances lead to $$V = \frac{R}{2N-X}I$$

where X denotes the number of broken conduction paths (i.e., the number of resistances set as an open circuit) across the TSV crack sensor circuit 402.

Returning to FIG. 4, TSVs 406(1)-406(N) may represent less than all of the TSVs 406 of the 3DIC 400 without departing from the spirit of the present teachings. Furthermore, although the controller 408 is shown internal to/embedded into the 3DIC 400, the present disclosure is not so limited, and the controller 408 may be located external to the 3DIC 400 without departing from the present teachings.

Figure 6:
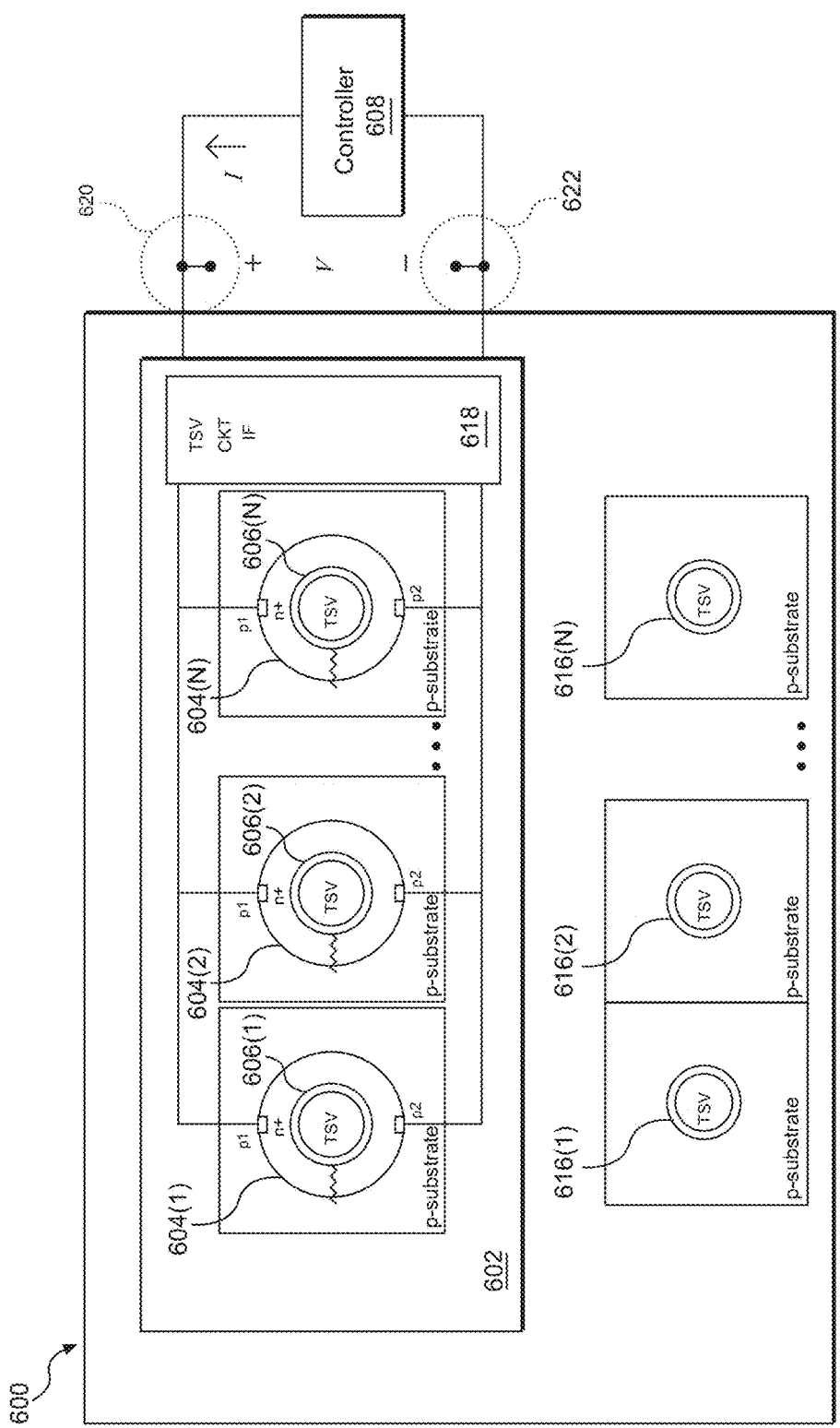
FIG. 6 illustrates an exemplary TSV circuit that includes multiple TSVs having corresponding TSV crack sensors and multiple TSVs that do not have a corresponding TSV crack sensor.

In this regard, FIG. 6 illustrates an exemplary 3DIC 600, including an exemplary TSV crack sensor circuit 602 that includes a plurality of TSV crack sensors 604(1)-604(N) for a plurality of corresponding TSVs 606(1)-606(N). The 3DIC 600 further includes a plurality of TSVs 616(1)-616(N) that do not include corresponding TSV crack sensors. Thus, 3DIC 600 illustrates an example in which TSVs surrounded by corresponding TSV crack sensors are less than all of the TSVs in the 3DIC. This allows testing for cracks in only selected TSVs (i.e., TSVs 606(1)-606(N)) which, for example, may be considered critical for the operation of the 3DIC 600 and/or are located in a section of the 3DIC 600 more likely to experience CTE mismatch-induced stress, without incurring the expense/complexity of providing TSV crack sensors for all of the TSVs in the 3DIC 600.

For example, and not as a limitation, the TSVs 606(1)-606(N) and 616(1)-616(N) may be TSVs of a TSV farm of the 3DIC 600. The TSV farm may be configured to carry a plurality of signals. The TSVs 606(1)-606(N), which include TSV crack sensors, may be configured such that each of the TSV's therein carries a unique signal from the plurality of signals. This is because a failure of a TSV carrying a unique signal may significantly or completely affect the performance of the 3DIC 600, making the testing of the TSVs 606(1)-606(N) necessary to ascertain the functionality of the 3DIC 600. On the other hand, the TSVs 616(1)-616(N), which do not include TSV crack sensors, may be configured such that multiple TSVs therein carry a single signal from the plurality of signals. This is because a failure of one of the multiple TSVs may not significantly affect the performance of the 3DIC 600, and thus, it may not be necessary for a TSV of the multiple TSVs to include a TSV crack sensor.

FIG. 6 further includes a TSV crack sensor circuit interface 618 for testing the TSV crack sensor circuit 602 using a controller 608 located external to the 3DIC 600 through first external connector 620 and second external connector 622. Accordingly, the controller 608 may provide the current I described above, and may act as an external voltage sensor to measure the voltage V described above. This may obviate the expense and complexity of adding an internal controller to the 3DIC 600.

Accordingly, providing a 3DIC, such as the 3DICs 400 and 600 described above, with a TSV crack sensor circuit 402 and 602, respectively, allows testing for at least one TSV crack extending beyond a corresponding KOZ. However, such testing does not indicate which TSV(s) is (are) defective. Therefore, such testing may not assist in determining whether the corresponding 3DIC may be operable for some or all of its intended functions.

Figure 7:
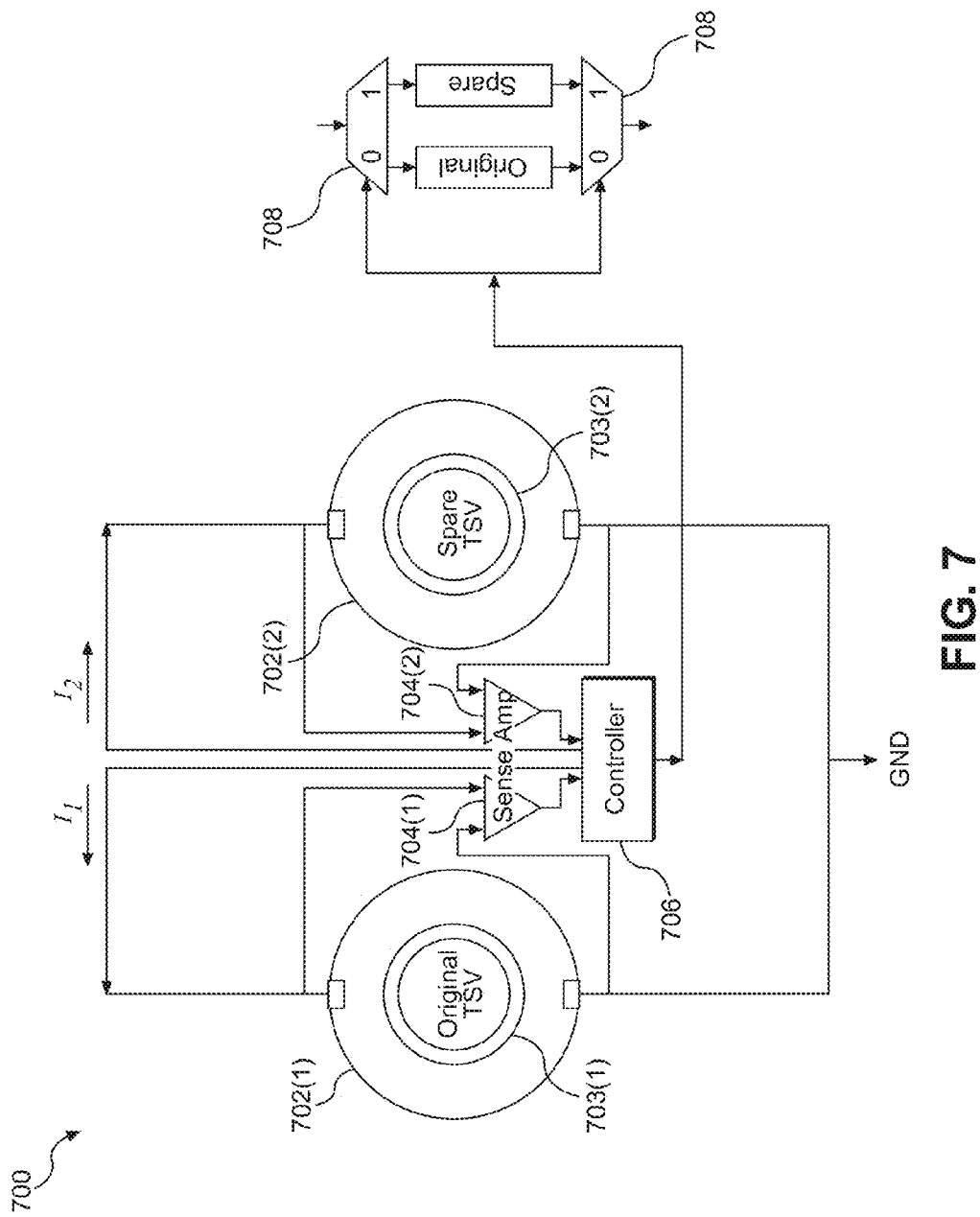
FIG. 7 illustrates an exemplary TSV redundant crack sensor circuit that includes a pair of redundant TSVs each having a corresponding TSV crack sensor.

In this regard, FIG. 7 illustrates an exemplary TSV redundant crack sensor circuit 700 that includes redundant TSV crack sensors 702 and TSVs 703. In this example, the TSV redundant crack sensor circuit 700 includes two (2) TSVs crack sensors 702(1) and 702(2) for TSVs 703(1) and 703(2), respectively. Each TSV crack sensor 702(1) and 702(2) includes a corresponding doped ring 308 and contacts P1 and P2 as illustrated in FIGS. 3A and 3B. These elements of the TSV crack sensors 702(1) and 702(2) are similar to those described with reference to FIGS. 3A and 3B, and thus, their description is omitted here to not obscure the description of the exemplary TSV redundant crack sensor circuit 700. As will be explained in further detail below, if a crack is detected by one of the TSV crack sensors 702(1)-702(2), and a crack is not detected by another of the TSV crack sensors 702(1)-702(2), the TSV 703(1)-703(2) associated with the TSV crack sensor 702(1)-702(2) that does not detect a crack can be used to provide a TSV connection for the corresponding 3DIC, and thus, allow usage of the 3DIC even though a crack extending beyond a KOZ occurred.

With continuing reference to FIG. 7, the TSV redundant crack sensor circuit 700 further includes sensor elements 704(1) and 704(2) coupled to the TSV crack sensors 702(1) and 702(2), respectively. The TSV redundant crack sensor circuit 700 further includes a controller 706 coupled to the sensor elements 704(1) and 704(2), and to a selection circuit 708. The sensor elements 704(1) and 704(2) may include sense amplifiers (not shown) to detect a discontinuity in a corresponding doped ring, and thus, a crack extending radially from a corresponding TSV 703(1)-703(2) beyond the corresponding doped ring. The selection circuit 708 may include a multiplexer configured to enable one of the TSVs 703(1) and 703(2) to provide connectivity between a pair of 3DIC layers.

In operation, currents $I_1$ and $I_2$ are provided into, and received by, the TSV crack sensors 702(1) and 702(2), respectively, by the controller 706. The sensor elements 704(1) and 704(2) measure a corresponding voltage across the contact terminals P1 and P2 of the TSV crack sensors 702(1) and 702(2), respectively, and indicate to the controller 706 if any of the TSV crack sensors 702(1) and 702(2) includes a crack extending radially through its doped ring. Specifically, if, as described with respect to FIGS. 3A and 3B, each doped ring of the TSV crack sensors 702(1) and 702(2) is set to cover at least a corresponding KOZ, an indication of a discontinuity in a doped ring provides an indication that a crack has reached a corresponding KOZ, rendering the corresponding 3DIC damaged or unusable.

If none of the TSV crack sensors 702(1) and 702(2) includes a crack extending radially through its corresponding doped ring, the controller 706 configures the selection circuit 708 to select one of the TSVs 703(1) and 703(2) for use as the TSV 703 of the TSV redundant crack sensor circuit 700. In this example, the selection may be arbitrary or based on a default TSV 703. If one of the TSV crack sensors 702(1) and 702(2) includes a crack extending radially through its corresponding doped ring, the controller 706 configures the selection circuit 708 to select the TSV 703 associated with the TSV crack sensor 702 that does not include the crack as the TSV 703 of the TSV redundant crack sensor circuit 700. If both of the TSV crack sensors 702(1) and 702(2) include a crack extending radially through their corresponding doped rings, then the TSV redundant crack sensor circuit 700 does not include an operable TSV 703 and the 3DIC may be deemed inoperable. The controller 706 may be configured to disable the TSV 703 from operating by configuring the selection circuit 708 to not select a TSV 703 of the TSV redundant crack sensor circuit 700 and/or may communicate with an external device (not shown) to report that the TSV redundant crack sensor circuit 700 does not include a working TSV 703.

Although the description above refers to the TSV redundant crack sensor circuit 700 as including two TSV crack sensors-TSV combinations, various modifications will be readily apparent to those skilled in the art, and the generic principles defined herein may be applied to other variations without departing from the spirit or scope of the disclosure. For example, the TSV redundant crack sensor circuit 700 may include more than two TSV crack sensors-TSV combinations. Furthermore, a 3DIC incorporating the TSV redundant crack sensor circuit 700 may do so in some or all TSVs therein, as is illustrated in FIG. 6 with respect to the exemplary 3DIC 600, in which not all of the TSV's therein include a corresponding TSV crack sensor, without departing from the spirit of the present teachings. This allows, for example, the use of TSV redundant crack sensor circuits in only selected TSVs which may be considered critical for the operation of the corresponding 3DIC and/or are located in a section of the 3DIC more likely to experience CTE mismatch-induced stress, without incurring the expense/complexity of providing TSV redundant crack sensors for all of the TSVs in the 3DIC.

For example, and not as a limitation, TSVs that are part of a TSV pair that includes a TSV redundant crack sensor and TSVs that are not part of a TSV pair including a TSV redundant crack sensor may be part of a TSV farm of the 3DIC 600. The TSV farm may be configured to carry a plurality of signals. The TSVs that are part of a TSV pair that includes a TSV redundant crack sensor may be configured such that the TSV's therein carry a unique signal from the plurality of signals. This is because a failure of a TSV carrying a unique signal may significantly or completely affect the performance of the 3DIC 600, making the use of TSV pairs including a TSV redundant crack sensor necessary to maintain the functionality of the 3DIC 600. On the other hand, TSVs that are not part of a TSV pair including a TSV redundant crack sensor may be configured such that multiple TSVs therein carry a single signal from the plurality of signals. This is because a failure of one of the multiple TSVs may not significantly affect the performance of the 3DIC 600, and thus, it may not be necessary for a TSV of the multiple TSVs to be part of a TSV pair including a TSV redundant crack sensor.

In addition, in the example illustrated in FIG. 7, the controller 706 is shown as providing currents $I_1$ and $I_2$ to the TSV crack sensors 702(1) and 702(2). However, currents $I_1$ and $I_2$ may be provided by other sources within the corresponding 3DIC, or may be provided from an external source, without departing from the present teachings.

Figure 8:
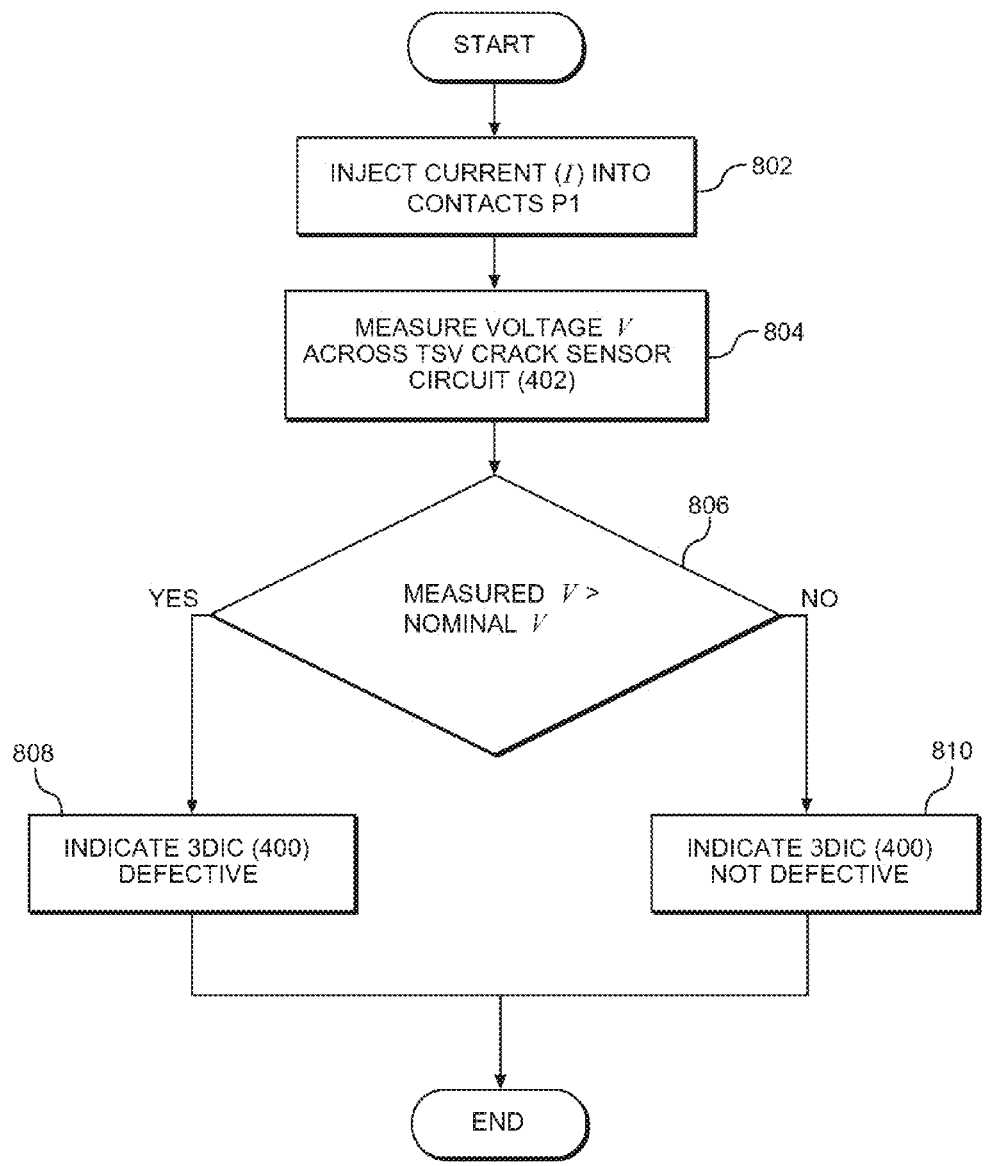
FIG. 8 is a flowchart illustrating an exemplary process for testing TSVs associated with a TSV crack sensor circuit in an exemplary 3DIC.

FIG. 8 illustrates an exemplary TSV crack sensing structure for the TSV crack sensor circuit 402 illustrated in FIG. 4. At step 802, a current I is provided into, and received by, a contact P1 of TSV crack sensors 404(1)-404(N). At step 804, a voltage V is measured across the network of parallel TSV crack sensors 404(1)-404(N) based on the current I. At step 806, the measured voltage V is compared to a nominal voltage, which is a voltage expected when none of the parallel TSV crack sensors 404(1)-404(N) include a crack across their corresponding doped rings and a current I is provided. If the measured voltage is higher than the nominal voltage, at step 808, an indication is provided that the 3DIC 400 is defective. If the measured voltage is substantially the same as the nominal voltage, at step 810, an indication is provided that the 3DIC 400 is not defective.

Figure 9:
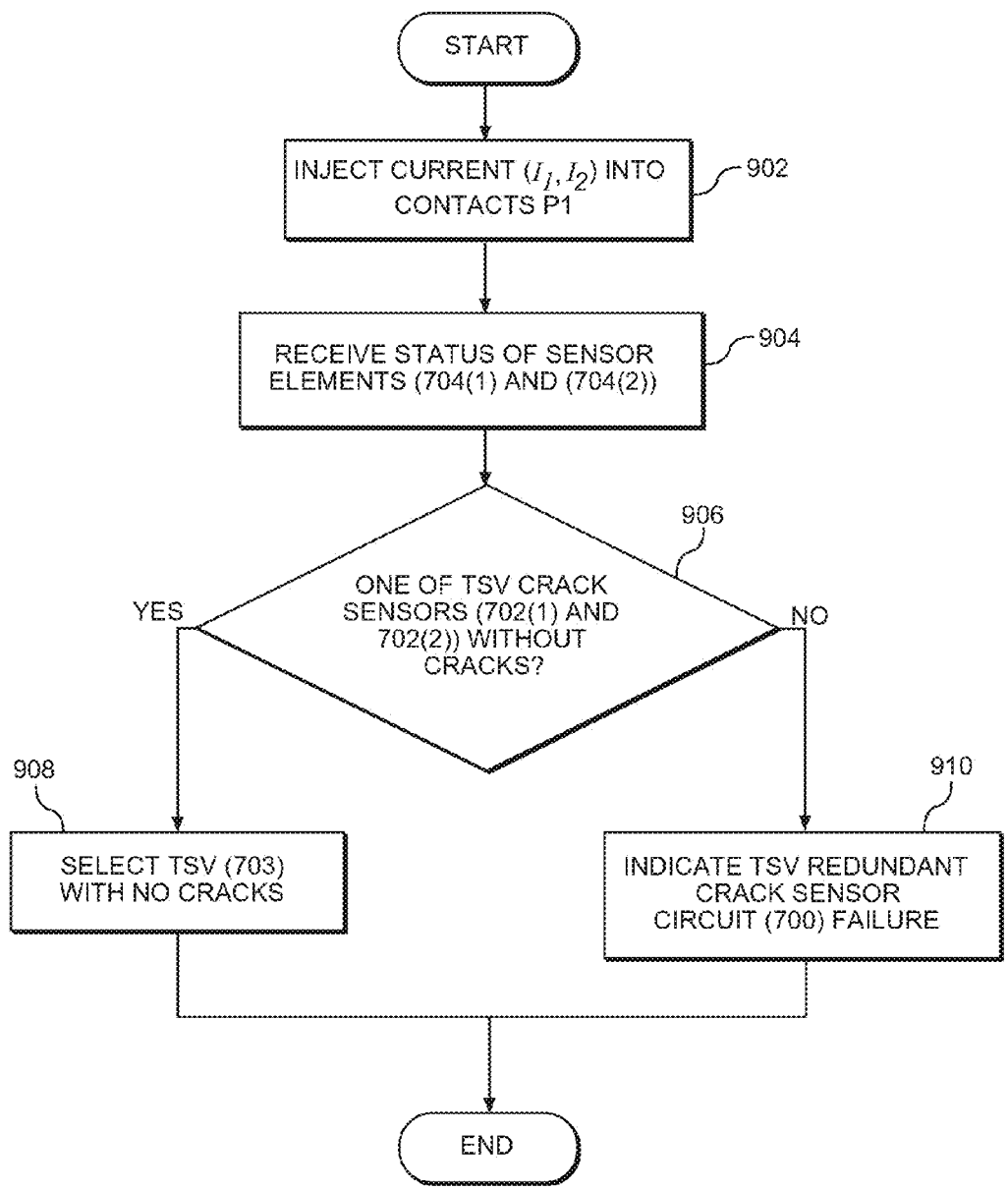
FIG. 9 is a flowchart illustrating an exemplary process for selecting a TSV from a TSV redundant crack sensor circuit that includes one or more redundant TSVs each having a corresponding TSV crack sensor in an exemplary 3DIC.

FIG. 9 illustrates an exemplary redundant TSV selection structure for the TSV redundant crack sensor circuit 700 in FIG. 7. At step 902, currents $I_1$ and $I_2$ are provided into, and received by, a contact P1 of the TSV redundant crack sensors 702(1) and 702(2), respectively, of the TSV redundant crack sensor circuit 700. At step 904, the controller 706 receives status information from the sensor elements 704(1) and 704(2) indicating if any of the TSV crack sensors 702(1) and 702(2) includes a crack extending across their corresponding doped rings, respectively. At step 906, the controller 706 determines if at least one of the TSV crack sensors 702(1) and 702(2) does not include a crack. If at least one of the TSV crack sensors 702(1) and 702(2) does not include a crack, at step 908 the controller 706 selects a TSV 703 corresponding to the TSV crack sensor 702 that does not include a crack for operation in the corresponding 3DIC. If both TSV crack sensors 702(1) and 702(2) include a crack, at step 910 the controller 706 provides an indication that the TSV redundant crack sensor circuit 700 does not include an operable TSV 703, i.e., a failure.

The TSV crack sensors for detecting TSV cracks in 3DICs according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 10:
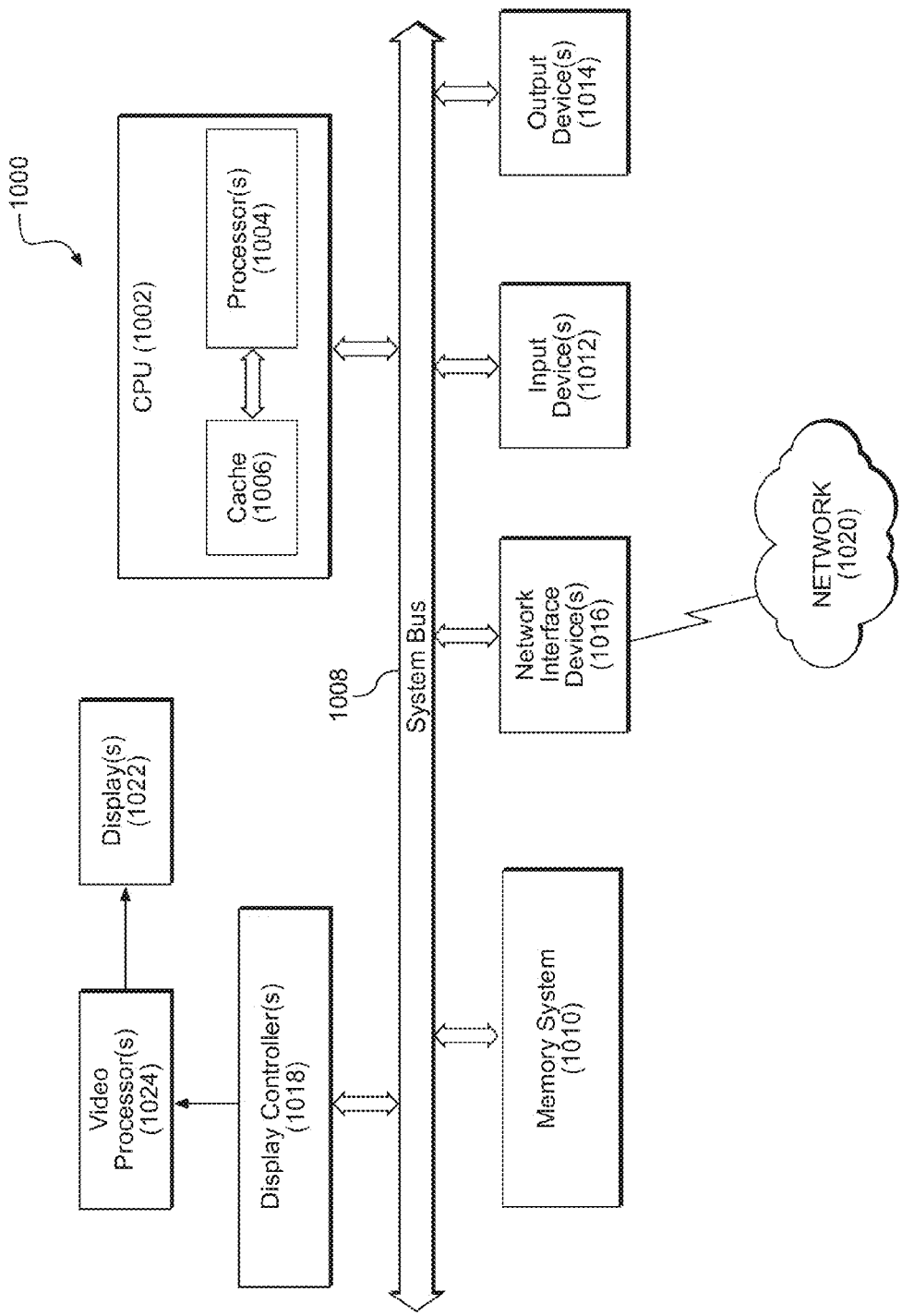
FIG. 10 is a block diagram of an exemplary processor-based system that can include a 3DIC according to the present disclosure.

In this regard, FIG. 10 illustrates an example of a processor-based system 1000 that can employ a 3DIC according to aspects of the disclosure, such as the 3DIC 400 illustrated in FIG. 4, comprising the TSV crack sensors and systems disclosed herein. In this example, the processor-based system 1000 includes one or more central processing units (CPUs) 1002, each including one or more processors 1004. The CPU(s) 1002 may have cache memory 1006 coupled to the processor(s) 1004 for rapid access to temporarily stored data. The CPU(s) 1002 is coupled to a system bus 1008 and can intercouple master and slave devices included in the processor-based system 1000. As is well known, the CPU(s) 1002 communicates with these other devices by exchanging address, control, and data information over the system bus 1008. For example, the CPU(s) 1002 can communicate bus transaction requests to a memory system 1010 as an example of a slave device. Although not illustrated in FIG. 10, multiple system buses 1008 could be provided, wherein each system bus 1008 constitutes a different fabric.

Other master and slave devices can be connected to the system bus 1008. As illustrated in FIG. 10, these devices can include the memory system 1010, one or more input devices 1012, one or more output devices 1014, one or more network interface devices 1016, and one or more display controllers 1018, as examples. The input device(s) 1012 can include any type of input device, including but not limited to input keys, switches, voice processors, etc. The output device(s) 1014 can include any type of output device, including but not limited to audio, video, other visual indicators, etc. The network interface device(s) 1016 can be any devices configured to allow exchange of data to and from a network 1020. The network 1020 can be any type of network, including but not limited to a wired or wireless network, a private or public network, a local area network (LAN), a wide local area network (WLAN), and the Internet. The network interface device(s) 1016 can be configured to support any type of communications protocol desired.

The CPU(s) 1002 may also be configured to access the display controller(s) 1018 over the system bus 1008 to control information sent to one or more displays 1022. The display controller(s) 1018 sends information to the display(s) 1022 to be displayed via one or more video processors 1024, which process the information to be displayed into a format suitable for the display(s) 1022. The display(s) 1022 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A three-dimensional integrated circuit (3DIC) comprising:
    a plurality of layers, each of the plurality of layers comprising a respective silicon substrate and at least a respective electrical circuit;
    a plurality of through-silicon vias (TSVs) configured to interconnect respective electrical circuits between at least two layers of the plurality of layers;
    a plurality of TSV crack sensors, each TSV crack sensor among the plurality of TSV crack sensors corresponding to a TSV of the plurality of TSVs and configured to detect a crack proximate the corresponding TSV, each TSV crack sensor, comprising:
        a doped ring disposed around the corresponding TSV;
        a first contact disposed on a first location of the doped ring; and
        a second contact disposed on a second location of the doped ring such that doped ring resistance comprising a parallel resistance of a first resistance and a second resistance is provided in the doped ring between the first contact and the second contact;
    a first interconnection coupled to the first contact of each TSV crack sensor among the plurality of TSV crack sensors and coupled to a first conductor; and
    a second interconnection coupled to the second contact of each TSV crack sensor among the plurality of TSV crack sensors and coupled to a second conductor.

2. The 3DIC of claim 1, configured to receive a current across the first conductor and the second conductor to generate a voltage (V) between the first interconnection and the second interconnection based on the doped ring resistance of each TSV crack sensor of the plurality of TSV crack sensors.

3. The 3DIC of claim 2, wherein each TSV crack sensor is configured to set one of the first resistance and the second resistance as an open circuit when a crack extends radially from the corresponding TSV through the corresponding doped ring.

4. The 3DIC of claim 3, wherein the voltage (V) between the first interconnection and the second interconnection is:

$$V = \frac{R}{2N - X} I$$

wherein R is a value of the first resistance and of the second resistance, N is a number of TSV crack sensors in the plurality of TSV crack sensors, and X is a number of resistances from a plurality of first resistances and a plurality of second resistances set as the open circuit when the crack extends radially from the corresponding TSV through the corresponding doped ring.

5. The 3DIC of claim 2, further comprising:
    a first external connector coupled to the first interconnection and configured to receive the current from an external source and to provide the voltage (V) to an external voltage sensor.

6. The 3DIC of claim 5, further comprising:
    a sensor coupled to the first interconnection and configured to measure the generated voltage.

7. The 3DIC of claim 2, further comprising:
    a controller coupled to the first interconnection and configured to provide the current.

8. The 3DIC of claim 7, further comprising:
a sensor coupled to the first interconnection and configured to measure the voltage (V).

9. The 3DIC of claim 2, wherein the first location of the corresponding doped ring is at a boundary of the corresponding doped ring and the second location of the corresponding doped ring is at another boundary of the corresponding doped ring such that the first location is symmetrically opposite to the second location relative to the corresponding TSV.

10. The 3DIC of claim 1, wherein each doped ring is an n+ type doped ring and is disposed on a p-substrate of a layer of the at least two layers.

11. The 3DIC of claim 1, wherein each doped ring is a p-type doped ring and is disposed on an n+ substrate of a layer of the at least two layers.

12. The 3DIC of claim 1, wherein each TSV of the plurality of TSVs comprises:
a conductive material configured to interconnect the at least two layers of the 3DIC; and
a dielectric liner disposed around the conductive material, configured to electrically isolate the conductive material from a substrate of the at least two layers.

13. The 3DIC of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

14. A method for testing a three-dimensional integrated circuit (3DIC) for through-silicon via (TSV) cracks, comprising:
providing a current to a first interconnection point of a network of parallel TSV crack sensors positioned between electrical circuits positioned on different layers of a 3DIC, wherein each layer of the 3DIC comprises a distinct substrate;
measuring a voltage across the network of the parallel TSV crack sensors based on the current;
comparing the measured voltage to a nominal voltage;
providing an indication that the 3DIC is defective because of a crack proximate a TSV if the measured voltage is higher than the nominal voltage; and
providing an indication that the 3DIC is not defective if the measured voltage is substantially equal to the nominal voltage.

15. A through-silicon via (TSV) redundant crack sensor circuit for a three-dimensional integrated circuit (3DIC), comprising:
a TSV pair configured to interconnect electrical circuits having respective substrates positioned on at least two layers of the 3DIC;
a TSV crack sensor pair, each TSV crack sensor of the TSV crack sensor pair corresponding to a TSV of the TSV pair and configured to detect a crack proximate the corresponding TSV, each TSV crack sensor comprising:
a doped ring disposed around the corresponding TSV;
a first contact disposed on a first location of the doped ring; and
a second contact disposed on a second location of the doped ring such that a first resistance and a second resistance are provided in the doped ring between the first contact and the second contact; and
a controller corresponding to the TSV pair, the controller coupled to each TSV crack sensor of the TSV crack sensor pair, the controller configured to select the TSV from the corresponding TSV pair based on sensor information from each TSV crack sensor of the corresponding TSV crack sensor pair.

16. The TSV redundant crack sensor circuit of claim 15, wherein the controller is configured to provide a current across the corresponding first contact and the second contact of each TSV of the corresponding TSV pair and to select the TSV of the corresponding TSV pair based on a resistance across each TSV of the corresponding TSV pair.

17. The TSV redundant crack sensor circuit of claim 16, wherein each TSV crack sensor of the TSV crack sensor pair is configured to set one of the first resistance and the second resistance as an open circuit when a crack extends radially from the corresponding TSV through the corresponding doped ring.

18. The TSV redundant crack sensor circuit of claim 17, further comprising:
a first external connector coupled to the controller and configured to provide, to an external device, an indication of the status of the TSV redundant crack sensor circuit.

19. The TSV redundant crack sensor circuit of claim 17, further comprising:
a sense amplifier pair, each sense amplifier of the sense amplifier pair corresponding to the TSV crack sensor of the TSV crack sensor pair, each sense amplifier coupled to the controller and configured to provide the sensor information from the corresponding TSV crack sensor to the controller; and
a multiplexer, coupled to the controller, for enabling the selected TSV from the corresponding TSV pair based on selection information from the controller.

20. The TSV redundant crack sensor circuit of claim 17, wherein the first location of the corresponding doped ring is at a boundary of the corresponding doped ring and the second location of the corresponding doped ring is at another boundary of the corresponding doped ring such that the first location is symmetrically opposite to the second location relative to the corresponding TSV.

21. The TSV redundant crack sensor circuit of claim 17, wherein each doped ring is an n+ type doped ring and is disposed on a p-substrate of a layer of the at least two layers.

22. The TSV redundant crack sensor circuit of claim 17, wherein each doped ring is a p-type doped ring and is disposed on an n+ substrate of a layer of the at least two layers.

23. The TSV redundant crack sensor circuit of claim 17, wherein each TSV of the TSV pair comprises:
a conductive material configured to interconnect the at least two layers of the 3DIC; and
a dielectric liner disposed around the conductive material, configured to electrically isolate the conductive material from a substrate of the at least two layers.

24. The TSV redundant crack sensor circuit of claim 17 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

25. A method for selecting a through-silicon via (TSV) in a TSV redundant crack sensor circuit for a three-dimensional integrated circuit (3DIC), comprising:
providing, by a current source, a current into a first contact of a first TSV crack sensor of a TSV crack sensor pair corresponding to a first TSV of a TSV pair, wherein the first TSV extends between a first electrical circuit in a first layer of the 3DIC to a second electrical circuit in a second layer of the 3DIC;
determining, by a control circuit, if a crack is not present in a doped ring disposed around the first TSV of the TSV pair; and
selecting, by the control circuit, the first TSV of the TSV pair when a processor determines that the crack is not present in the doped ring disposed around the first TSV of the TSV pair.

26. The method of claim 25, further comprising:
providing, by the current source, a second current into a first contact of a second TSV crack sensor of the TSV crack sensor pair corresponding to a second TSV of the TSV pair;
determining, by the control circuit, if the crack is not present in a doped ring disposed around the second TSV of the TSV pair when the control circuit determines that the crack is present in the doped ring disposed around the first TSV of the TSV pair;
selecting, by the control circuit, the second TSV of the TSV pair when the control circuit determines that the crack is present in the doped ring disposed around the first TSV of the TSV pair and the crack is not present in the doped ring disposed around the second TSV of the TSV pair; and
providing, by the control circuit, an indication that the TSV redundant crack sensor circuit fails when the control circuit determines that the crack is present in the doped ring disposed around the first TSV of the TSV pair and the crack is present in the doped ring disposed around the second TSV of the TSV pair.

27. The method of claim 25, wherein the current source is comprised of the processor.

* * * * *